United States Patent
Wong et al.

[19]

[11] Patent Number: 6,037,720
[45] Date of Patent: Mar. 14, 2000

[54] LEVEL SHIFTER

[75] Inventors: Stephen L. Wong, Cupertino, Calif.; Paul Veldman, Oss; Eugene J. De Mol, Eindhoven, both of Netherlands

[73] Assignee: Philips Electronics North America Corporation, New York, N.Y.

[21] Appl. No.: 09/177,964

[22] Filed: Oct. 23, 1998

[51] Int. Cl.$^7$ ...................................................... G05F 1/00
[52] U.S. Cl. ..................... 315/291; 315/224; 315/209 R; 363/16; 363/95; 327/108; 327/236
[58] Field of Search ................................ 315/209 R, 224, 315/225, 291, 307, 308, DIG. 7; 363/16, 17, 95, 98, 97, 132; 327/108, 112, 236, 259, 263, 264

[56] References Cited

U.S. PATENT DOCUMENTS

| | | | |
|---|---|---|---|
| 4,829,415 | 5/1989 | Haferl | 363/26 |
| 4,994,955 | 2/1991 | Schoofs et al. | 363/95 |
| 5,068,571 | 11/1991 | Schoofs | 315/205 |
| 5,543,740 | 8/1996 | Wong | 327/108 |
| 5,545,955 | 8/1996 | Wood | 315/224 |
| 5,684,683 | 11/1997 | Divan et al. | 363/17 X |
| 5,781,418 | 7/1998 | Chang et al. | 363/16 |

FOREIGN PATENT DOCUMENTS

2306062A  4/1997  United Kingdom .

*Primary Examiner*—Haissa Philogene
*Attorney, Agent, or Firm*—Robert J. Kraus

[57] ABSTRACT

A switched bridge circuit includes a low voltage to high voltage interface which selectively controls an input to a high side switch. A controller compares the voltage across the interface, the state of the high side switch, and the output of the circuit. If hard switching is detected by the controller, it latches the voltage across the interface thus keeping the high side switch on to allow the hard switching to occur. If soft switching is detected, the high side switch is kept off. A source follower is used to drive the high side switch so that the circuit output follows the interface output thereby avoiding oscillation. A falling edge detector for the output of the circuit uses the inherent parasitic capacitance of a high voltage device which also forms a bootstrap diode. When the output drops, the parasitic capacitance feeds a resistance which causes a driver to actuate. A second falling edge detector uses the inherent parasitic capacitance of the level shifter switch which is another high voltage device. When the output drops, the parasitic capacitance turns on a switch. A rising edge detector also uses the inherent capacitance of the low voltage to high voltage interface. A switch is coupled to the circuit output and the low voltage to high voltage interface. When the circuit output rises, the switch actuates.

24 Claims, 9 Drawing Sheets

LEVEL SHIFTER

BACKGROUND OF THE INVENTION

This invention relates to a semiconductor switched bridge circuit which minimizes the number of high voltage components through feedback based inherent parasitic capacitance and which controls circuit output by differentiating between hard and soft switching.

High voltage half-bridge circuits are used in many power applications including D.C. to A.C. converters, motion control devices, switch mode power supplies, power motors, and lighting ballasts. A high side switch and a low side switch selectively couple a source voltage to an output node VHB. These switched circuits control high side switching. Ideally, the output of these circuits should be a high frequency, high voltage square wave feeding at least a partially reactive load.

The output voltage VHB can be partially driven, in steady-state operation, by oscillation generated by reactive elements within the load. When the low side switch conducts, the inductor in the load conducts as well. When the low side switch is turned off, the inductor tries to keep current flowing by raising the voltage at node VHB up to the DC rail. This is called "soft" switching.

The current flowing through the inductor may not be large enough to raise the VHB voltage to the D.C. rail due, in part, to the counteracting capacitive affect from both parasitic and discrete capacitances. Once the voltage at node VHB stops increasing (dVHB/dt=0), it is desirable to turn the high side switch on (i.e. referred to as "hard switching") to continue the increase. Such switching is necessary during initial start-up of the circuit and when power has been dissipated in the load. Conversely, when the high side switch is turned off while there is still current running through it, the inductor will try to bring the voltage at node VHB to the ground rail. Hard switching may be necessary to reach the ground rail.

Unfortunately, hard switching dissipates power. To minimize the power dissipated, the high side switch should be turned on when the voltage at node VHB is at a high level caused by power being fed from the partially inductive load. At this point, there is a low voltage drop and thus minimal power dissipation. Clearly, zero voltage switching, that is when the voltage at node VHB is at the D.C. rail, is not possible during start up because there is no energy in the inductive load to raise the voltage VHB to the rail voltage. Therefore, at least during start-up periods, hard-switching is required.

In U.S. Pat. No. 5,068,571 a high voltage capacitor is used to detect the transition periods of the output. A transition is sensed in this capacitor when the current through it (Cdv/dt) is not equal to zero. This is output to amplifiers which keep both switches off during any transition in the output.

This solves the problem of a false turn-on due to parasitic currents thereby making the circuit lower power and thus more integrable. However, it also prevents the high side switch from being able to turn on during a hard switching condition. Such hard switching is commonly necessary in many power converter applications (including zero voltage switching applications) as is stated above. Hard switching is especially needed during the initial powering of the device. U.S. Pat. No. 5,068,571, which does not allow hard switching, would hinder the powering up of the circuit. Additionally, it requires a dedicated high voltage capacitor which again increases the number of high voltage components thus defeating the area saving benefit of a single-ended solution.

Therefore, there exists a need for a circuit which can control the high and low side switches in response to whether hard or soft switching is desired and which limits the number of high voltage components.

SUMMARY AND OBJECTS OF THE INVENTION

In one aspect of the invention, a switched bridge has a circuit output, a controller, and at least a first and second switch. A low voltage to high voltage interface has an interface output. The controller compares the interface output with the circuit output and distinguishes between hard switching and soft switching of the switched bridge circuit based upon said comparison. In one distinctive feature, the controller distinguishes between hard and soft switching. In another feature, the interface output is taken across an inherent capacitance of the low voltage to high voltage interface. In yet another feature, the first switch is controlled so that an input to the first switch follows and is limited to said interface output.

This aspect of the invention controls the actuation of either a low or high side switch depending on the type of switching occurring. Hard switching with high dVHB/dt is thus avoided and no additional components are necessary.

In another aspect of the invention, a switched bridge detects a change in a circuit output of said switched bridge. The switched bridge includes at least a first and second switch controlling the circuit output. An auxiliary power source has an inherent capacitance coupled to the circuit output through an impedance. The inherent capacitance is further coupled to an input of the first switch. In this way, if the circuit output undergoes a transition, the inherent capacitance affects the state of the first switch thereby indicating the transition.

In this way an inherent parasitic capacitance can be used to indicate when VHB is falling or rising. This information can then be fed to an adaptive non-overlap circuit so that shoot-through and high dVHB/dt during hard switching is avoided. An external high voltage capacitor is not required. This solution is present in the following aspect as well.

In still another aspect of the present invention, a switched bridge detects a transition in a circuit output of the switched bridge. The switched bridge includes at least a first and second switch controlling said circuit output. A low voltage to high voltage interface has an interface output and an inherent capacitance. The inherent capacitance is coupled to an input of a third switch. In this way, the third switch is actuated based on the inherent capacitance and in response to the transition of the circuit output.

A yet still another aspect of the present invention is a method for controlling the operation of a switched bridge circuit at least a first and second switch, a low voltage to high voltage interface having an interface output, and a circuit output. The method includes comparing the circuit output and the interface output, determining a type of switching occurring based upon the step of comparing, and controlling the first switch based upon the step of determining.

This aspect, like the first one listed, ensures that there is not a high dVHB/dt during hard switching.

In another aspect of the present invention, a switched bridge having a circuit output, includes at least a first and second switch, a first switch driver, a low voltage to high voltage interface having an interface output, and a latch. The low voltage to high voltage interface is coupled to the first switch driver through the latch. The first switch driver has a source follower so that voltage at the circuit output follows voltage at the interface output.

In this way, dVHB/dt is limited during hard switching of either the high side switch or the low side switch.

It is an object of the invention to provide an inexpensive switched bridge circuit.

It is another object of the invention to provide a switched bridge circuit which controls the change in its output during hard switching.

It is still another object of the present invention to provide a switched bridge circuit that is capable of distinguishing between hard and soft switching.

It is yet still another object of the invention to overcome the problem of parasitic capacitances produced by high voltage elements which actuate the driver of switches in a switched bridge circuit.

It is another object of the present invention to provide a switched bridge circuit that does not require a dedicated high voltage capacitor.

It is still another object of the present invention to provide a switched bridge circuit which turns off the high side switch when the output amplitude decreases.

The present invention produces these objects by providing a low power, integrable switched bridge circuit that incorporates features in its level shifter to overcome the problems of controlling high voltage bridge elements during transition periods and specifically during, hard switching. The inherent parasitic capacitances of existing high voltage transistors are used to implement the transition detectors needed at the ground and floating levels. This avoids the need to use one or more expensive dedicated high voltage capacitors.

These objects, as well as others, will become more apparent from the following description read in conjunction with the accompanying drawings where like reference numerals are intended to designate the same elements.

DETAILED DESCRIPTION OF THE PREFERRED EMBODIMENTS

Figure 1:
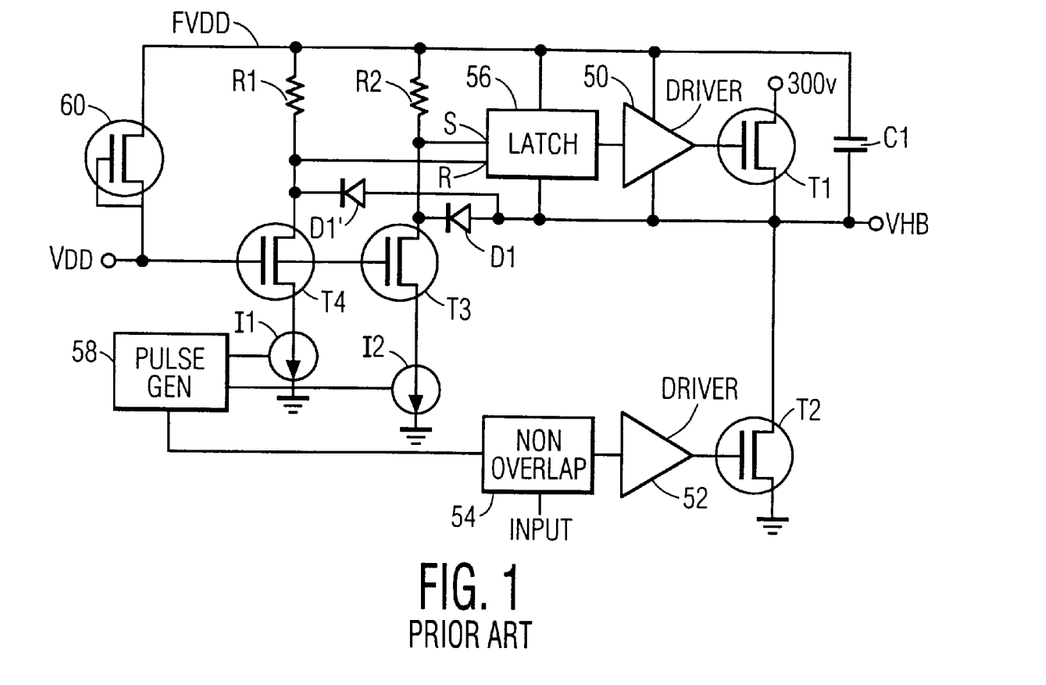
FIG. 1 is a schematic of a prior art switched half bridge circuit.

Recent prior art devices attempt to solve the above problems using a configuration similar to that shown in FIG. 1. A pulse generator 58 supplies current pulses for current sources I1 and I2 which selectively turn on or off switches T4 and T3 respectively. A voltage source VDD supplies the gates of switches T4 and T3. Bootstrap diode 60 (shown as a MOSFET with the gate and source coupled) is connected to VDD thereby creating a voltage FVDD (floating VDD) on its drain side. Capacitor C1, disposed between FVDD and output VHB, is charged by bootstrap diode 60. When VHB goes low, C1 charges from bootstrap diode 60 and then C1 can discharge to power the devices in the circuit.

Resistors R1 and R2 are coupled between FVDD and switches T4 and T3 respectively. A diode D1 is disposed between output VHB and the drain of switch T3. A diode D1' is coupled between output VHB and the drain of transistor T4. A latch 56 receives input from the drains of switches T3 and T4 and controls non-inverting driver 50 to selectively turn on or off high side switch T1. Pulse generator 58 is controlled by a non-overlap circuit 54 which, through non-inverting driver 52, selectively turns on or off low side switch T2.

In operation, the outputs from switches T3 and T4 set or reset latch 56. In this way, only a pulse is needed to change the state of high side switch T1. To turn on high side switch T1, a pulse is generated by pulse generator 58 for current source I2. This turns on T3 which creates a signal at the set input of latch 56. Once this input is received, it is latched and high side switch T1 remains on. A similar operation involving I1 and T4 will pull high side switch T1 off. If only a single switch were used without a latch (as in FIG. 2 described below), it would be necessary to have constant current to maintain a desired state of high side switch T1. (The state would depend on whether the driver was inverting or non-inverting). This might result in a large power dissipation.

The main problem with this type of configuration is that it requires two or more high voltage shifting elements. Such elements are typically very large and thus costly. Additionally, a pulse generator and resistors are needed which also increases the cost.

Figure 2:
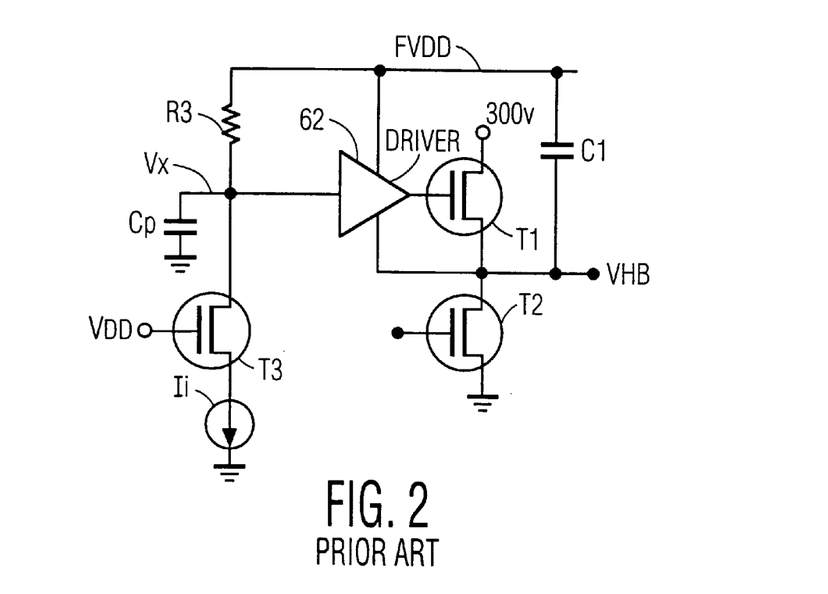
FIG. 2 is a schematic of another prior art switched half bridge circuit.

Other prior art devices were single-ended designs using a configuration similar to that in FIG. 2. Input current Ii selectively commutates switch T3 thereby affecting the voltage level at level shifter output node Vx. When switch T3 is off, Vx is dependent upon the voltage in bootstrap capacitor C1 which in turn is powered by bootstrap diode 60 and VDD (both shown in FIG. 1). Switch T3 thus acts as a buffer with high voltage on one side and low voltage on the other. Vx is coupled through resistor R3 to FVDD. Vx controls non-inverting driver 62 which drives high side switch T1.

When high side switch T1 is to turn off, current must flow from Vx so that driver 62 sees a low input. This means switch T3 must be turned on and power must dissipate in resistor R3 due to the flowing current. If an inverting driver were used, a constant current at Vx would be required to keep T1 on. It should be apparent that having a non-inverting driver allows for less power to be dissipated. This is because, in a non-inverting driver, constant current through Vx would be needed to keep T1 off which brings VHB low. This means there is a low voltage drop across R3 because the voltage FVDD is VHB plus the voltage stored in capacitor c1 (approximately 12 volts). If an inverting driver were used, a constant current through node Vx would be needed to keep T1 on and so there would be approximately 300+12 (VHB with T1 on)=312 volts at FVDD.

These configurations are deficient because, either way, power is constantly dissipated through resistor R3. Additionally, a parasitic capacitance Cp is present at the drain node of transistor T3. (Since VDD is a low DC voltage, Cp could be measured from the drain to the gate or from the drain to ground. Moreover, Cp could also be viewed as the sum of all the parasitic capacitances in the circuit.) T3 is a high voltage transistor and so Cp could be of the order of a pico-farad. As Vx is charged from 0 to 300V, a high amount of power is required to forcibly charge and discharge Cp. One way of solving this problem is to provide excessive input current Ii. As a consequence, these types of circuits are generally implemented more as discrete than as integrated circuits. Clearly, this is not an optimal solution.

Figure 11:
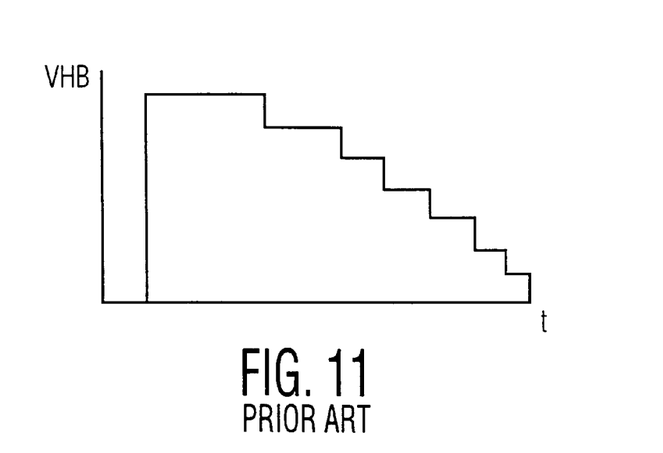
FIG. 11 is a diagram showing the output of a switched bridge circuit according to one version of the prior art.

Moreover, if a lower power level shifter were used, the desired states of high side switch T1 and low side switch T2 could not be maintained. This is because the input to non-inverting driver 62 is Vx-VHB. If T3 turns on creating current through Vx, Vx goes low with respect to VHB turning off high side switch T1 thus causing VHB to go low. However, parasitic capacitance Cp keeps the voltage Vx from changing instantaneously. Vx will not fall as fast as VHB. Eventually, Vx will be greater than VHB, thus actuating non-inverting driver 62 and turning T1 back on. This will continue in a step-like manner as is shown in FIG. 11. Ergo, as VHB goes through a negative transition, Vx will be kept high by Cp thereby keeping high side switch T1 on. Conversely, while VHB goes through a positive transition, Cp will keep Vx low thereby turning off high side switch T1. During falling transitions of VHB, this is always an undesirable occurrence. During rising transitions, it is desirable to avoid these effects while hard switching is occurring.

Figure 3:
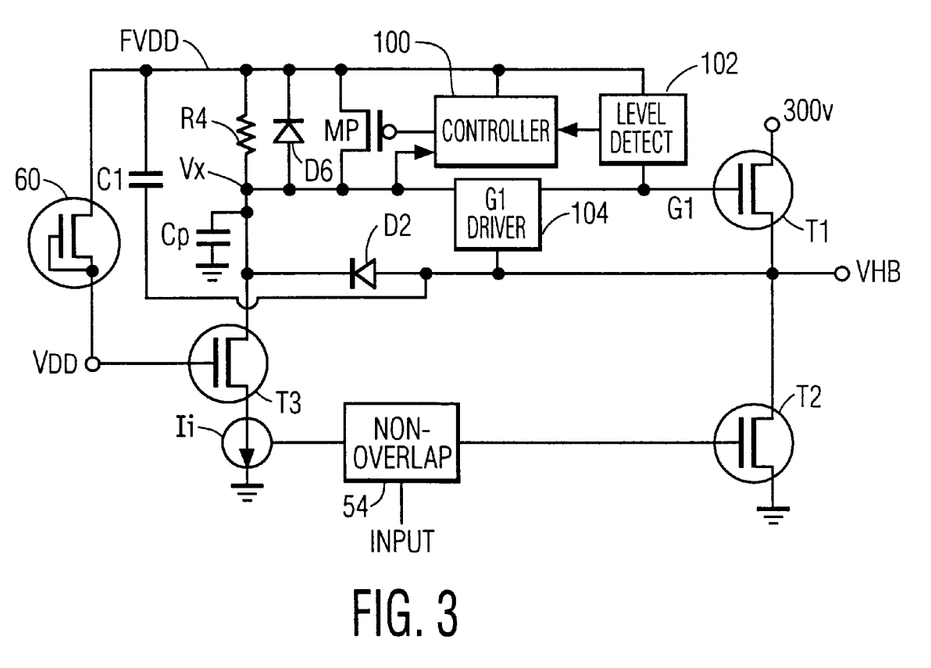
FIG. 3 is a block diagram/schematic of a switched half bridge circuit according to the present invention.
Figure 10:
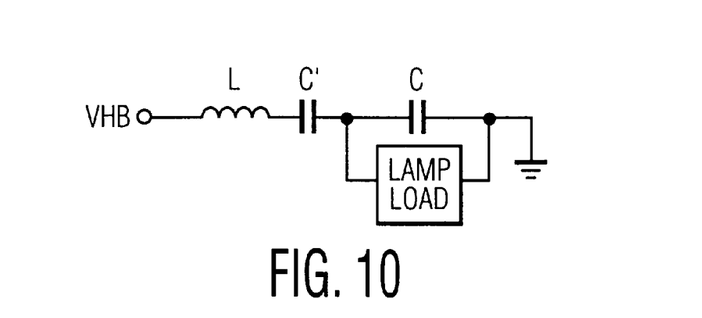
FIG. 10 is schematic of a representative load for the present invention.

Referring to FIG. 3, in accordance with the invention, a controller 100 evaluates inputs from a level detector 102 and Vx (Vx, again, rests at the voltage level of bootstrap capacitor C1 and reflects the voltage across Cp). Controller 100 has an output coupled to the gate of PMOS transistor NP whose source and drain is in parallel with a resistor R4 and a diode D6 (the diode is used to pull Vx down during situations of high -dVHB/dt where T3 may not be able to pull Vx down quick enough; the diode configuration itself will generally be an integral part of PMOS mp). Level detector 102 is coupled to gate G1 of high side switch T1. A G1 driver 104 is coupled to Gate G1 of high side switch T1 and to Vx. A low voltage to high voltage interface (hereinafter also "transistor" or "switch") T3 is coupled between Vx and a current source delivering a current Ii. A ground side switch T2 is coupled between the source of high side switch T1 and ground. A 300V DC rail is coupled to the drain of high side switch T1. Bootstrap capacitor C1, as before, powers the devices in the circuit. Finally, a diode D2 is coupled between the source of high side switch T1 (drain of T2) and Vx. Output VHB is taken at the junction between the source of transistor T1 and the drain of transistor T2. Output VHB could be used for a load like that shown in FIG. 10 where output VHB feeds inductor L and capacitor C, said capacitor being in parallel with a lamp load. A DC coupling capacitor C' is usually disposed between inductor L and the parallel combination of the lamp load and capacitor C.

Figure 3A:
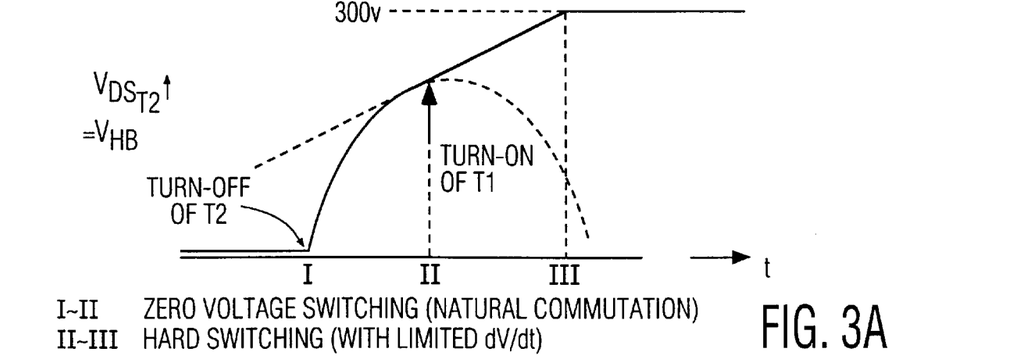
FIG. 3A is a diagram showing the rise in the output of the invention without a PMOS enhancement.
Figure 3B:
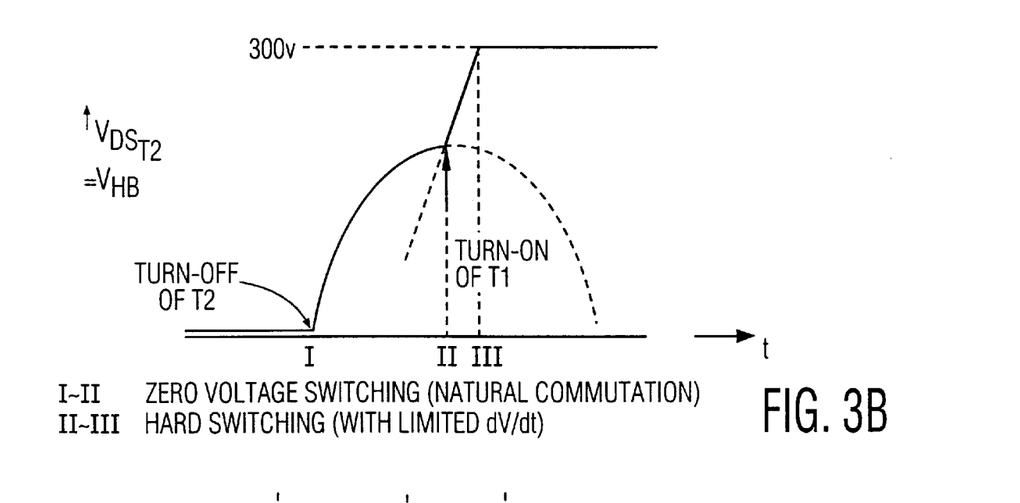
FIG. 3B is a diagram showing the rise in the output of the invention with the PMOS enhancement.

If VHB is being driven by the inductive load as in soft-switching, VHB will lead Vx through diode D2 and so there is no need to turn T1 on. Conversely, during hard-switching, Vx will lead VHB) and it is desirable to allow Vx to pull up quickly. This can all be accomplished with a pull-up element—resistor R4, whose current is supplemented by that of the PMOS transistor mp. Referring momentarily to FIGS. 3A and 3B, PMOS transistor mp affects the change in VHB (dVHB/dt). During soft switching, when T1 is to remain off, mp allows a lower dVHB/dt. Once dVHB/dt=0, T1 turns on (hard switching) and dVHB/dt increases.

Figure 3C:
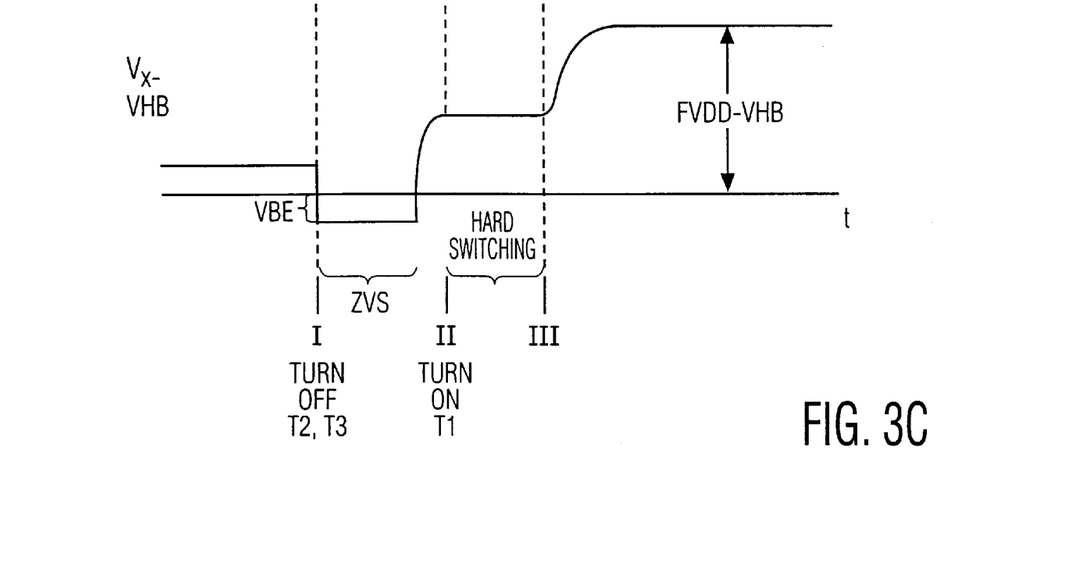
FIG. 3C is a diagram showing the relationship of the inputs to the high side driver for the switched half bridge circuit according to the invention.

Referring simultaneously to FIGS. 3A and 3C, when VHB rises during soft switching, Vx follows VHB but is kept one diode drop lower than VHB because of diode D2. When VHB reaches its highest level, now Vx will begin to rise because it is pulled by FVDD and so Vx-VHB starts to become positive. Eventually, Vx-VHB reaches the point where T1 is turned on, hard switching occurs, and Vx equals FVDD.

Referring back to FIG. 3, during hard switching, the level shifter output node Vx is high with respect to VHB but gate G1 has not fully risen over a preset value. The lagging of gate G1 is due to large Miller currents which flow out of the gate during a rising transition of VHB. The level of Vx and gate G1 with respect to VHB is read by controller 100. When a hard pull-up is detected by controller 100, controller 100 turns on a PMOS switch mp thereby lowering the effective resistance of resistor R4 and allowing parasitic capacitor Cp to charge at a rate at least equal to that of VHB thus keeping Vx-VHB positive. This maintains a high level to the input of G1 Driver 104, keeping high side switch T1 on in a limited fashion. Thus, if T1 is on, it is kept on through the actuation of PMOS transistor mp which lowers the resistance of resistor R4 and the step-like transitions similar to those of FIG. 11 (except in this case rising instead of falling) are avoided.

When T1 is to be turned off, Ii is turned on thus turning T3 on. The current going through T3 must pull Vx low with respect to VHB so that G1 Driver 104 turns T1 off. The current that is sunk through T3, along with the voltage at Vx, represents loss. To minimize the loss, it is desirable to keep the current through T3 as low as possible. Level detector 102 is used to set the trip point for sensing the level of G1. This trip point is set so that, during hard switching, G1 will be just above the threshold level and so T1 is on in a limited fashion. Once the transition of VHB is completed, the Miller current subsides and Gate G1 can rise above the preset value because G1 is pulled to FVDD. This signals controller 100 to turn off PMOS switch mp and Vx returns to control of input Ii thereby reducing the current that T3 has to sink to adequately bring the Vx node low.

Controller 100 is able to discern a soft pull-up as being when both Vx and Gate G1 are low with respect to VHB while VHB rises. During this transition, it is desirable for high side switch T1 to remain off and so PMOS switch mp is kept off thereby retaining resistor R4 in series with parasitic capacitor Cp. As a consequence, T1 will never turn on as long as VHB is leading VX because PMOS switch mp will not be turned on. Thus, the time constant, represented by resistor R4 and parasitic capacitor Cp, used to enable G1 driver 104, is altered depending on the switching of output VHB.

Figure 4:
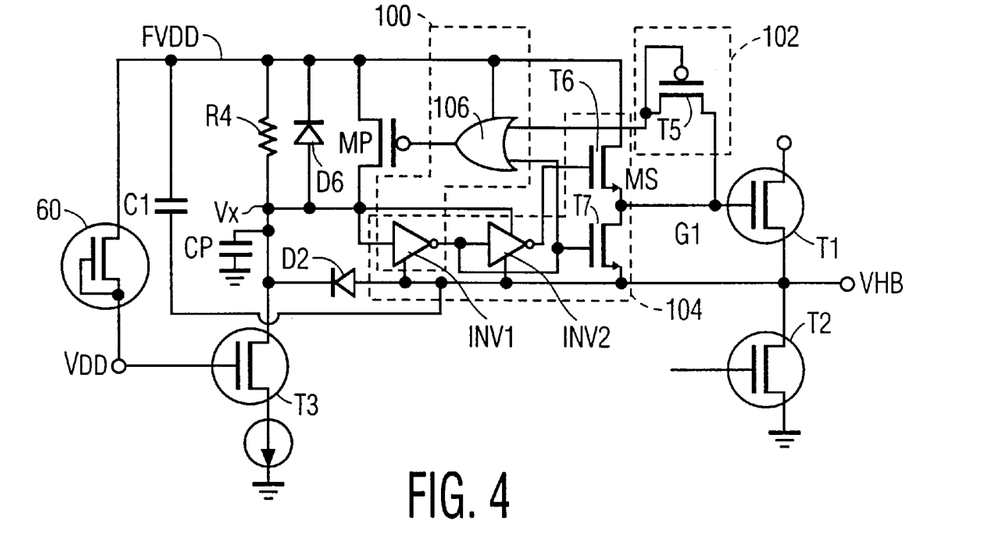
FIG. 4 is a schematic of a possible implementation of the present invention shown in FIG. 3.

One way of implementing the circuit of FIG. 3 is shown in FIG. 4. As can be observed, controller 100 is realized through the use of an "OR" gate 106 and inverter INV1. Level detector 102 is a diode configured PMOS transistor T5. PMOS transistor T5 sets the preset level for Gate G1 to be one PMOS threshold level above the threshold for OR gate 106. G1 driver 104 is implemented with a source follower transistor T6 having a source coupled to the drain of a transistor T7. The junction of the source of T6 and the drain of T7 is coupled to Gate G1. G1 driver 104 also uses inverter INV2 and shares inverter INV1. Vx is used as the input to inverter INV1 and also caps the output swing of inverter INV2. Inverter INV1 feeds its output into inverter INV2, an input of OR gate 106, and to the gate of transistor T7. Inverter INV2 feeds into the gate of transistor T6.

Figure 4A:
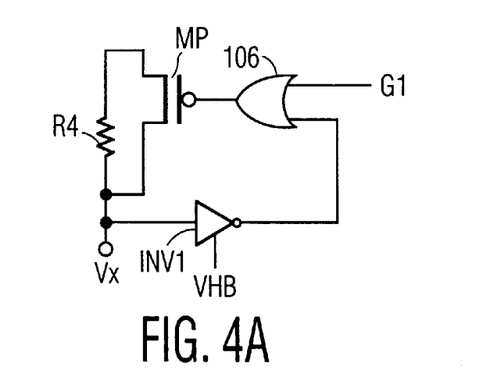
FIG. 4A is a schematic of a sensing circuit that forms a portion of the circuit shown in FIG. 4.
Figure 4B:
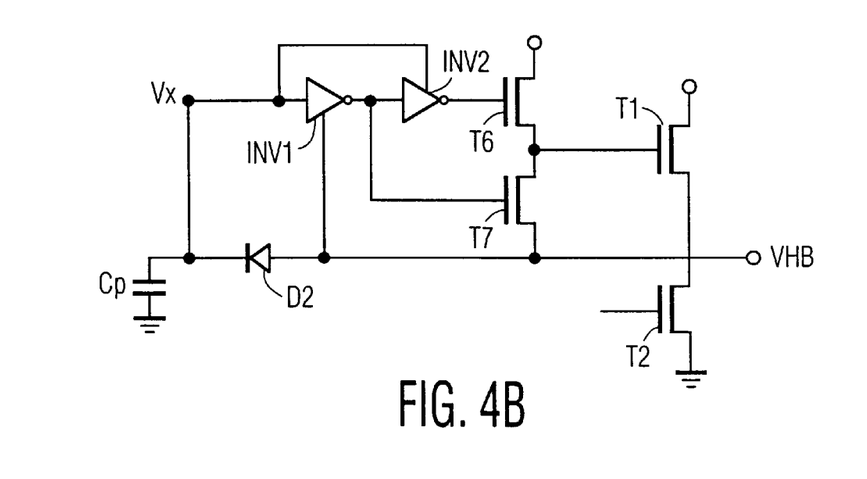
FIG. 4B is a schematic of a driving circuit that forms another portion of the circuit shown in FIG. 4.

The circuit of FIG. 4 can be viewed as two distinct circuits as shown in a simplified form in FIGS. 4A and 4B. FIG. 4A is a greater circuit. Inverter INV1 compares Vx with VHB. If Vx is greater than VHB (plus the threshold of the inverter), as would be the case where hard-switching is needed, then OR gate 106 is actuated to keep Vx high. This is effectuated by turning PMOS transistor mp on, lowering the effective resistance of resistor R4. High side switch T1 is thus allowed to turn on. Once T1 does fully turn on, and hard switching is over or has not occurred, OR gate 106 receives this information from transistor T5 and releases Vx through PMOS transistor mp.

FIG. 4B is a driving circuit that keeps T1 off during soft pull-up but allows T1 to turn on in a controlled manner (with limited dVHB/dt) during hard switching as to avoid oscillation effects. As VHB rises (+dVHB/dt due to the inductive load) during soft switching, R4 limits the current through Cp and so Vx cannot be greater than VHB. When Vx is less than VHB, there is a high output from INV1 which actuates T7 shutting T1 off. Once dVHB/dt≈0 (this will occur when VHB reaches 300V or, if the inductor does not have enough current, the highest point of VHB), Vx will exceed VHB (because Vx is tied to FVDD through resistor R4). This will cause T6, and consequently T1, to turn on.

During hard switching, inverter INV2 is used to limit the output to transistor T6 at Vx. Transistor T6 is made as a source follower so that gate G1 also follows Vx. As a result, we have a double voltage follower so that VHB follows Vx. Once T1 turns on, VHB increases. If there were a voltage gain between Vx and VHB, VHB would rise quicker than Vx, changing the output of INV1 and INV2 causing T1 to turn off (undesirable oscillation in T1). The double voltage follower ensures that VHB can not rise faster than Vx. It limits the loop gain thereby avoiding any oscillation effects and maintaining stability.

The purpose of the double inverter (INV1, INV2) is to allow gate G1 to turn on with a sharp trip point during hard switching as dictated by the input threshold of INV1. However, by capping the output of INV2 to Vx, the degree of turn on is limited so that VHB does not exceed Vx. Ergo, during hard switching, Vx is kept high to keep T1 on but the dVHB/dt is limited (because of Cp) so that the change does not get so high that T1 gets turned off by VHB exceeding Vx (i.e. Vx-VHB is negative) which would result in instability. Clearly, a similar source follower-type driver could be implemented to drive low side switch T2 to prevent high −dVHB/dt during hard switching. This could be accomplished by creating a comparable node Vx' that is capacitively coupled to VHB, FVDD or Vx.

As was stated above, non-overlap circuit 54 ensures that both high side switch T1 and low side switch T2 are not turned on at the same time. When T1 is to be turned on, non-overlap circuit 54 first turns T2 off, then turns Ii and T3 off thereby allowing Vx to follow the rise of VHB as was stated above. When it is desirable to turn T2 on, non-overlap circuit 54 first turns Ii and T3 on thus providing a path to ground for Vx. Vx then is lower than VHB (eventually one diode drop D2 lower) which turns T1 off. Then, non-overlap circuit 54 turns on T2.

Figure 5:
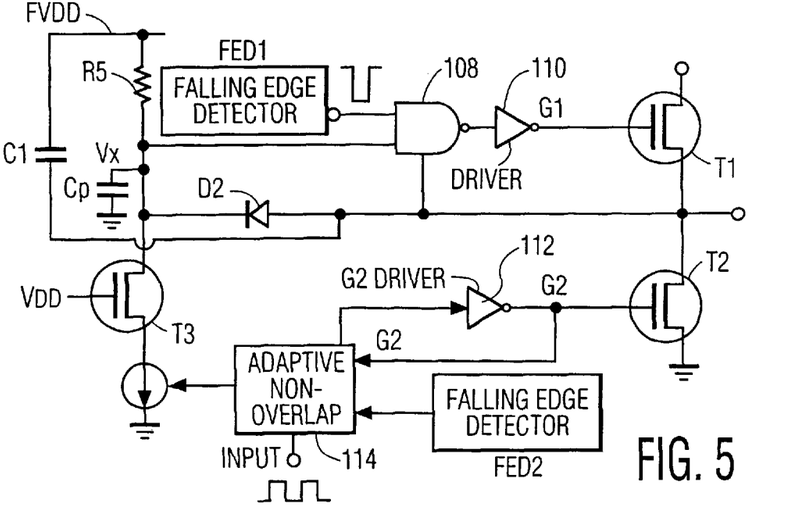
FIG. 5 is a block diagram/schematic of a switched bridge circuit according to a second embodiment of the present invention.

A second embodiment is shown in FIG. 5. Vx, referenced to VHB, and a falling edge detector FED1, also referenced to VHB, are fed into a NAND gate 108 (This produces Vx-VHB NAND FED1-VHB). NAND gate 108 feeds G1 Driver 110. FED1 will keep T1 off during −dVHB/dt as is explained more clearly below. A second falling edge detector FED2 along with the output of a G2 driver 112 feed into an adaptive non-overlap ("ANO") circuit 114. Both falling edge detectors detect the falling edge of output VHB. ANO circuit 114 in turn controls low side switch T2 through G2 driver 112, and high side switch T1 through switch T3. The ANO circuit ensures that both T1 and T2 are never on at the same time which would cause a shoot through that would be destructive to T1 and T2.

Figure 6A:
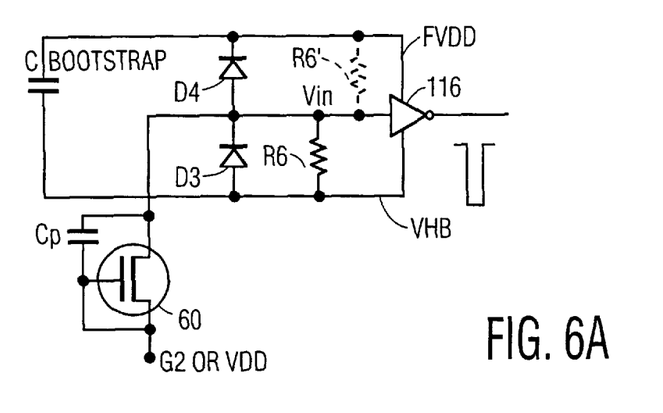
FIG. 6A is schematic of a first falling edge detector according to the present invention.

Referring now to FIG. 6A, the implementation of falling edge detector FED1 will be explained. It should be noted that existing components of a bootstrap circuit are used to realize falling edge detector FED1. This sharing of components (especially the high voltage bootstrap diode 60) is beneficial because it results in a decrease in cost and size.

Falling edge detector FED1 utilizes the parasitic capacitance of bootstrap diode 60. A bootstrap capacitor bootstrap is placed in parallel with a series combination of diodes D3 and D4. A resistor R6 is disposed in parallel with D3. A node Vin is defined at the junction between D3 and D4. VHB is then the voltage level at the side of resistor R6 and diode D3 opposite that of Vin. Bootstrap diode 60, along with parasitic capacitor Cp, feeds into node Vin. Vin, along with VHB, is then fed to inverting amplifier 116 which produces the output for FED1.

When VHB is low, bootstrap is charged from VDD through diode 60 and diode D4. Cbootstrap powers inverting amplifier 116. As long as VHB is greater than VDD, diode D3 is forward biased and there is no drop across resistor R6. When VHB drops, there is produced a potential difference across R6 because Vin can not change instantaneously due to Cp. The relative change in voltage across R6 (−Cdv/dt) causes Cp to discharge some of its stored energy in the form of current through R6 which causes inverter 116 to go high and G1 to go low. Thus, high side switch T1 is kept off during falling edges of VHB.

In a typical bootstrap configuration, diode 60 is tied directly to a bootstrap capacitor. Power is then drawn from that capacitor. This means that node Vin is always high (always at VDD or FVDD) and the output is always low. Such an output would be useless in this application. By adding diodes D3 and D4 and taking Vin at the junction between the two diodes, we obtain an output that can go low or high depending on the level of VHB.

To accommodate this dual functionality, another modification from a typical bootstrap configuration also had to be made. The input to bootstrap diode 60, must be tied to G2 instead of VDD. If the input is always VDD, Vin would be high whenever VHB goes low, R6 would conduct and, through driver 116, AND gate 108 (FIG. 5), and G1 driver 110, T1 would turn off However, when the circuit is first started up, VHB is low. If the input VDD is kept high and VHB starts off low, T1 will never turn on and the circuit will never start up. A more useful source is G2. This input goes high when VHB is high and low when VHB is low. This allows the circuit to power up but falling edges in VHB will still be detected through the use of Cp. Bootstrap diode 60, cbootstrap, and VDD thus form an auxiliary power source.

Figure 6B:
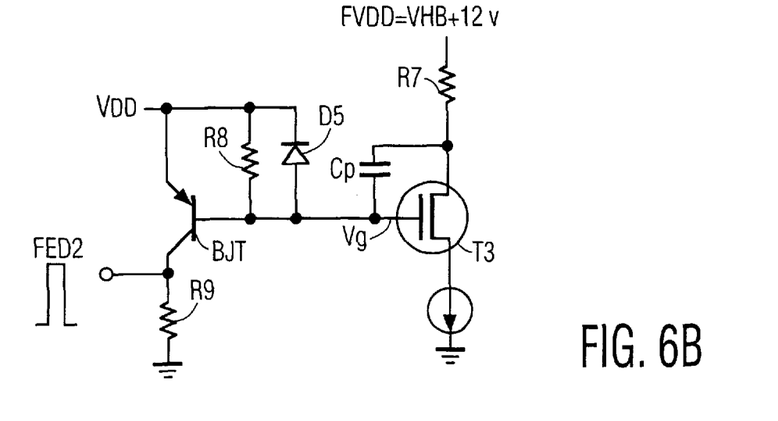
FIG. 6B is schematic of a second falling edge detector according to the present invention.

Referring to FIG. 6B, the implementation of the second falling edge detector will be explained. FVDD(which is virtually equal to VHB plus a constant voltage) is fed through a resistor R7 to the drain of transistor T3. As has been described above, parasitic capacitor Cp will appear between the gate and drain of T3. The gate of T3 is coupled to the base of a pnp bipolar junction transistor BJT. Between the base and emitter of BJT is a resistor R8 in parallel with a clamping diode D5. The output of FED2 is taken from the collector of BJT and is fed to ground by resistor R9. A voltage source VDD is coupled to the emitter of BJT.

As can be discerned, the voltage at the gate of transistor T3 is Vg which is equal to VDD±0.7 v (VBE). When VHB drops, the charge on Cp pushes the base of BJT low thus turning it on and causing the output of FED2 to go high. Thus, as in the previous embodiment, an inherent parasitic capacitor Cp of a required high voltage element is used as a solution for the problem which it creates.

Figure 7:
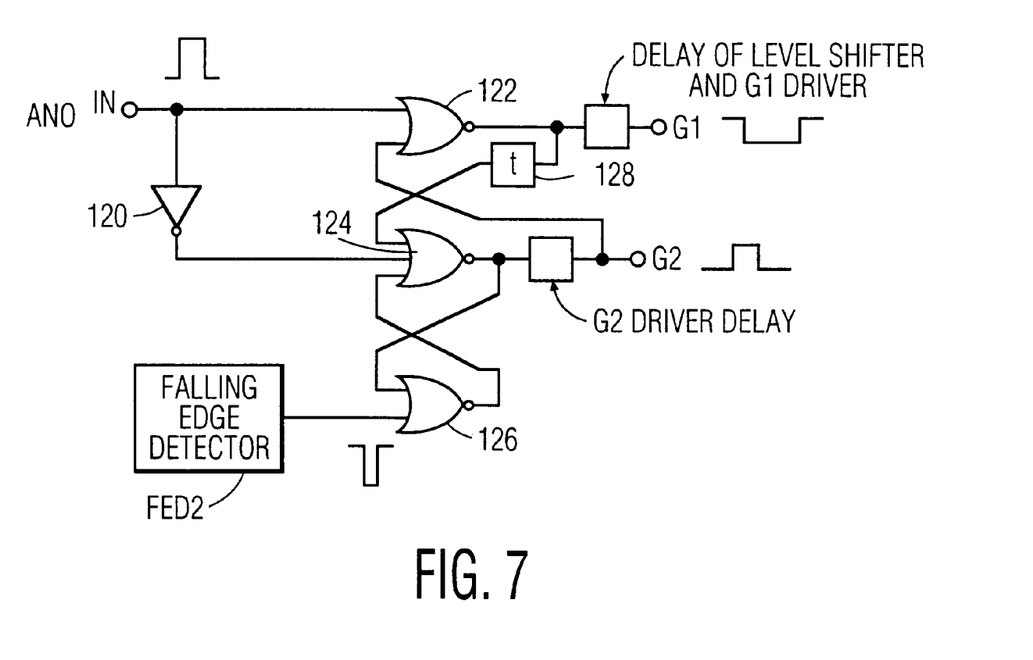
FIG. 7 is a schematic of an adaptive non-overlap circuit according to the present invention.

The adaptive non-overlap circuit of FIG. 5 can be implemented using the configuration shown in FIG. 7. This circuit is intended to ensure that G2 (the gate of T2) does not go high until G1 goes low plus some delay. As stated above, G1 is dictated by the state of T3 which is now controlled by adaptive non-overlap circuit 114. An oscillator produces an input pulse waveform ANOIN that is fed to NOR gate 122 and inverter 120. Inverter 120 feeds NOR gate 124. The output of NOR gate 124, after a G2 driver delay, is fed to Gate G2 and into NOR gate 122. The output of NOR gate 122 is passed through a delay 128 to an input of NOR gate 124. The output of NOR gate 122 is also fed to Gate G1 after a level shifter and G1 driver delay. The output at G1 can not be taken directly because of its high voltage. This is why the input to NOR gate 124 is taken before the level shifter and delay 128 is used to compensate for the delay that will be caused by the level shifter and the G1 driver.

With this configuration, G2 can not go high and turn on T2 until both of the following conditions are met: 1) G1 is low for a time delay period and 2) the input from ANOIN is high. As an added precaution, the output from falling edge detector FED2 could be added. FED2 is fed to NOR gate 126 along with the output from NOR gate 124. The output from NOR gate 126 then produces a third input into NOR gate 124. Now a third condition must be met before G2 will go high –3) there is no falling edge of VHB.

Figure 8:
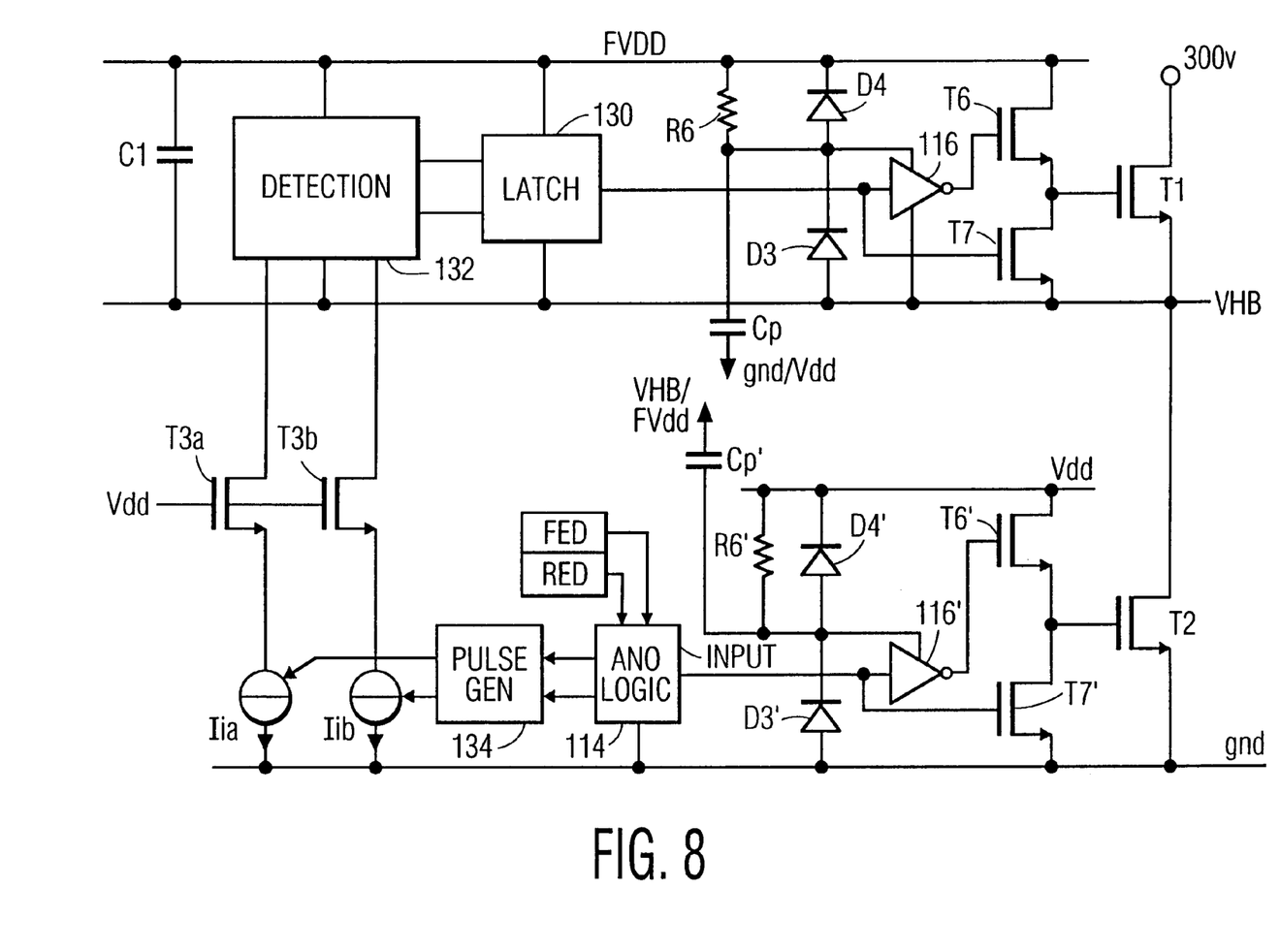
FIG. 8 is a schematic of an extension of the present invention for a latched type circuit.

The same inventive ideas described above could be implemented in a latched-type circuit as in FIG. 8. The high side switch is controlled by a pulse generator 134 which actuates one of two switches T3a or T3b to cause an input to detector 132 of latch 130. The drive for gate 1 is similar to that in FIG. 4 with a source follower being used to actuate high side switch T1. A falling edge detector FED and a rising edge detector RED feed into ANO 114.

Figure 12:
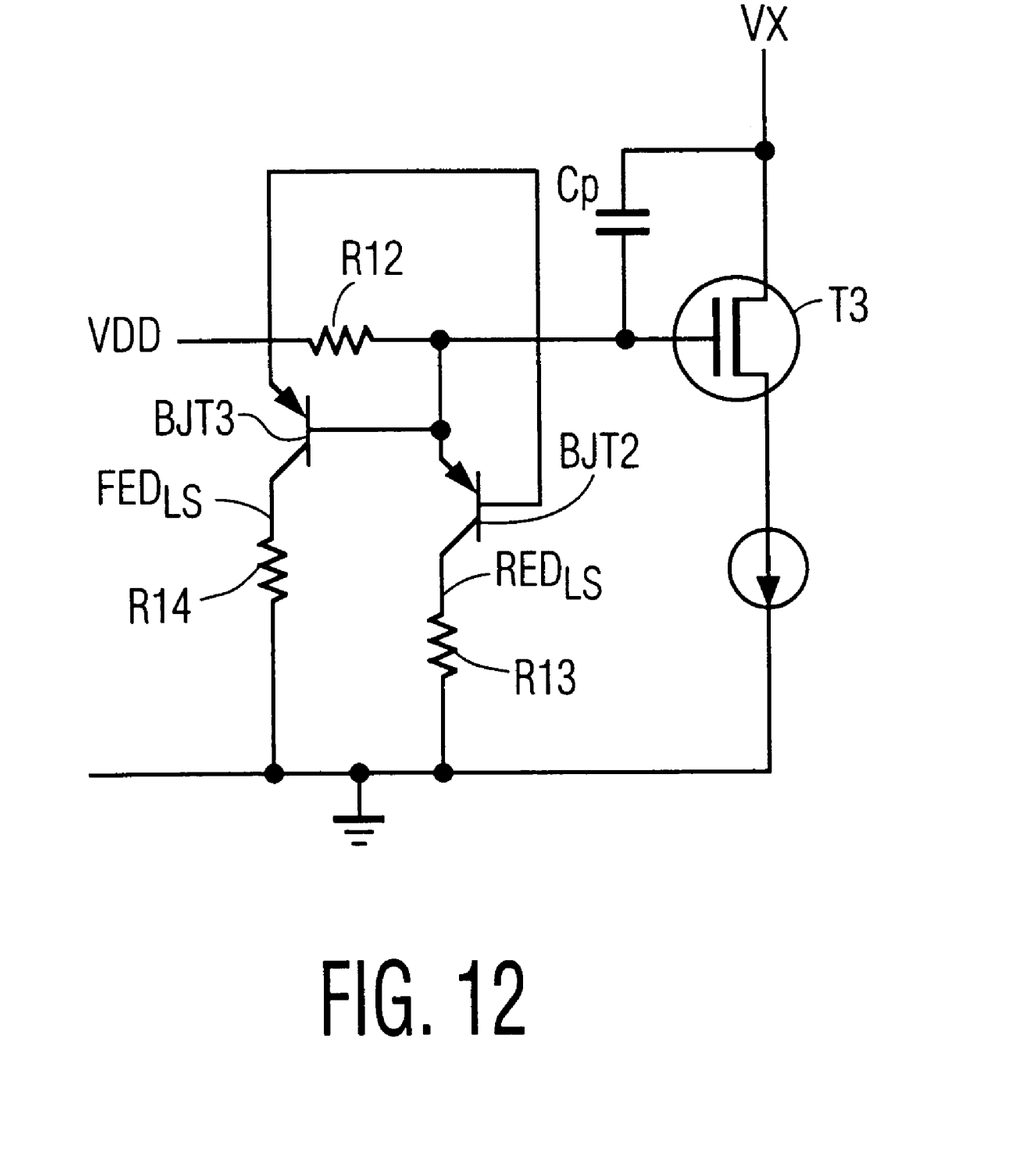
FIG. 12 is a schematic of a combination falling edge detector and rising edge detector.

The FED and RED are shown in FIG. 12. The gate of transistor T3 is coupled to the gate of a pnp bipolar junction transistor BJT2, a resistor R12 and VDD. The emitter of BJT2 is also coupled to R12 and to the base of a bipolar junction transistor BJT3. The collector of BJT2 forms the RED$_{LS}$ output and is coupled to ground through a resistor R13. The collector of BJT3 forms the FED$_{LS}$ output and is coupled to ground through a resistor R14. A rising edge at VHB activates BJT2 and blocks BJT1. Thus, there is a high voltage at REDLS during a rising edge and a high voltage at FED$_{LS}$ during a falling edge.

Figure 9:
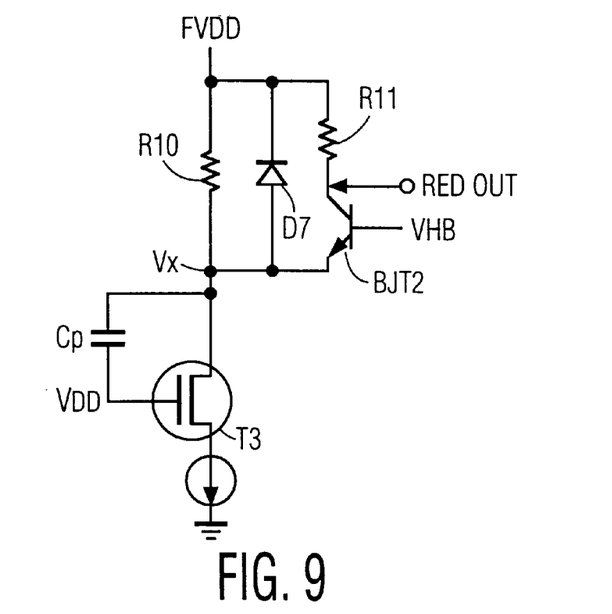
FIG. 9 is a schematic of a rising edge detector according to the present invention.

The Rising Edge Detector can also be implemented as shown in FIG. 9. VHB is coupled to the base of an npn transistor BJT2. Vx is coupled to the emitter of BJT2. A resistor R10 and a diode D7 are disposed in parallel between Vx and FVDD. The output of the rising edge detector REDout is taken at the collector of BJT2. A resistor R11 is disposed between REDout and FVDD.

Vx is normally kept higher than VHB because Vx is tied to FVDD through resistor R10. When there is a positive increase of VHB (+dVHB/dt), Vx can not keep up with VHB because the current required to charge Cp is limited by R10. This causes Vx to be less than VHB which turns on BJT2 bringing REDout down; which is detected. Diode D7 is used to discharge Vx during negative transitions of VHB.

Alternatively, a Rising Edge Detector could be realized by altering the configuration of a Falling Edge Detector as was shown in FIG. 6A. Basically, if resistor R6' were tied to FVDD instead of VHB—as is shown in phantom—when VHB rises, the same phenomena as in FIG. 9 would occur. The input to the inverter will normally be high because R6' is pulled to the voltage of FVDD and there is no drop across the resistor and thus no current through it. When VHB rises, FVDD will also increase. Vin will not be able to keep up with FVDD because of parasitic capacitor Cp. This will cause a drop across resistor R6 which will induce current at the input of inverter 116.

Referring back to FIG. 8, in prior art latched-type circuits, a hard logic signal is used which means that there could be high dVHB/dt during hard switching. This has the potential of damaging the devices that have just conducted. By having VHB follow Vx (through source follower T6 and inverting driver 116), a soft turn-on is created because Vx is limited by Cp. Some prior art devices use an external solution for achieving the soft turn-on. However, such an external solution is problematic because it must match the power device. Here, the dVHB/dt is limited by the design parameters of the chip and so it is independent of the external device used.

As can be discerned, by utilizing the inherent capacitances of existing switched bridge circuits and providing a forward loop from the control input to the output which has no gain, the invention is able to realize the objects mentioned above.

Having described the preferred embodiments it should be made apparent that various changes could be made without departing from the scope and spirit of the invention which is defined more clearly in the appended claims.

For example, MOSFETs and BJTs are shown in the drawings and described in the specification. Clearly, those with ordinary skill in the art would be able to replace these devices with other similar switching circuitry without departing from the scope of the invention.

In the figures, resistors R4, R5 and R7 are given different labels but it should be apparent to one skilled in the art that one resistor could be used instead of three.

Low side switch T2 is shown as a MOSFET. One skilled in the art would recognize that the same inventive ideas would apply when low side switch T2 were a diode as in a down converter. In such a situation, the diode would be considered a voltage dependent switch that conducts when voltage is applied positively but blocks when negative voltage is applied.

What is claimed is:

1. A switched bridge having a circuit output, said switched bridge comprising:
   a controller;
   at least a first and second switch; and
   a low voltage to high voltage interface which has an interface output;
   wherein said controller compares said interface output with said circuit output and distinguishes between hard switching and soft switching of said switched bridge circuit based upon said comparison.

2. The switched bridge of claim 1 wherein said controller selectively keeps said first switch on or off in response to said comparison.

3. The switched bridge of claim 1 wherein:
   said low voltage to high voltage interface has inherent capacitance; and
   said interface output is taken across said inherent capacitance.

4. The switched bridge of claim 3 further including:
   a third switch for controlling the rise and fall time of voltage across said inherent capacitance.

5. The switched bridge of claim 1 wherein the first switch is controlled so that a voltage at an input of said first switch follows a voltage at said interface output.

6. The switched bridge of claim 5 wherein said first switch is further controlled by a latch coupled to said low voltage to high voltage interface.

7. The switched bridge of claim 1 wherein when said interface output is greater than said circuit output, said controller maintains said interface output greater than said circuit output.

8. The switched bridge of claim 1 further comprising:
   an auxiliary power source having an inherent capacitance, said inherent capacitance being coupled to said circuit output through an impedance; and
   said inherent capacitance further being coupled to an input of said first switch;
   whereby if said circuit output undergoes a transition in value, said inherent capacitance affects the state of said first switch thereby indicating said transition.

9. The switched bridge of claim 8 wherein said auxiliary power source is controlled by an input to said second switch.

10. The switched bridge of claim 1 wherein:
    said low voltage to high voltage interface has inherent capacitance; and
    said inherent capacitance is coupled to an input of a third switch;
    wherein said third switch is actuated based on the inherent capacitance and in response to a transition of the circuit output.

11. The switched bridge of claim 1 wherein said controller includes an inverter.

12. The switched bridge of claim 11 further including a third switch for controlling the rise and fall time of voltage at the interface output.

13. The switched bridge of claim 1, further including a driver for turning the first switch on, said driver serves as a voltage follower whereby the voltage to an input of said first switch follows the voltage at the interface output.

14. The switched bridge of claim 1 further comprising at least a third switch coupled to said circuit output wherein:
    said low voltage to high voltage interface has inherent capacitance;
    said third switch is further coupled to said interface output; and
    said interface output is further coupled to a power source;
    wherein, said third switch is actuated based upon said inherent capacitance and in response to a transition in said circuit output.

15. The switched bridge of claim 1 further comprising a third switch and wherein:
    said low voltage to high voltage interface has inherent capacitance, said interface output being taken across said capacitance;
    said controller keeps said first switch on or off by selectively actuating said third switch, said third switch controlling the rise and fall time of voltage across said inherent capacitance; and
    said controller further controls said first switch so that a voltage at an input of said first switch follows a voltage at said interface output.

16. A lighting ballast which uses the switched bridge of claim 1.

17. A switched bridge which detects a change in a circuit output of said switched bridge, said switched bridge comprising:
    at least a first and second switch controlling the value of said circuit output;
    an auxiliary power source having inherent capacitance;
    said inherent capacitance being coupled to said circuit output through an impedance; and
    said inherent capacitance further being coupled to an input of said first switch;
    wherein said first switch is actuated based upon said inherent capacitance and in response to said circuit output undergoing a transition.

18. The switched bridge of claim 17 where said auxiliary power source is controlled by an input to said second switch.

19. A switched bridge which detects a transition in a circuit output of said switched bridge, said switched bridge comprising:
    at least a first and second switch controlling said circuit output;
    a low voltage to high voltage interface having an interface output and inherent capacitance; and
    said inherent capacitance being coupled to an input of a third switch;
    wherein said third switch is actuated based on the inherent capacitance and in response to said transition of the circuit output.

20. A method for controlling the operation of a switched bridge having at least a first and second switch, a low voltage to high voltage interface having an interface output, and a circuit output, said method comprising the steps of:
    comparing said circuit output and said interface output;
    determining a type of switching occurring based upon said step of comparing; and
    controlling said first switch based upon said step of determining.

21. The method of claim 20 wherein:
    said low voltage to high voltage interface has inherent capacitance; and
    said interface output is taken across said inherent capacitance.

22. The method of claim 20 wherein said step of controlling includes controlling the voltage at an input to said first switch so that said voltage follows the voltage at said interface output.

23. The method of claim 20 further including:

keeping said first switch on when said switching is hard switching; and keeping said first switch off when said switching is soft switching.

24. A switched bridge having a circuit output, said switched bridge comprising:

at least a first and second switch;

a first switch driver, having a first switch driver input;

a low voltage to high voltage interface;

a latch;

said low voltage to high voltage interface being coupled to said first switch driver through said latch; and said first switch driver having a source follower whereby voltage at said circuit output follows voltage at said first switch driver input.

* * * * *